United States Patent
Tong

(10) Patent No.: US 8,558,198 B2
(45) Date of Patent: Oct. 15, 2013

(54) BEAM LINE SYSTEM OF ION IMPLANTER

(75) Inventor: Boon-Chau Tong, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 224 days.

(21) Appl. No.: 13/177,621

(22) Filed: Jul. 7, 2011

(65) Prior Publication Data

US 2013/0009075 A1  Jan. 10, 2013

(51) Int. Cl.
*G21G 5/00* (2006.01)

(52) U.S. Cl.
USPC ............... 250/492.3; 250/492.1; 250/492.2; 250/396 R; 250/398; 250/396 ML

(58) Field of Classification Search
USPC ........ 250/396 R, 396 ML, 398, 492.1, 492.2, 250/492.3
See application file for complete search history.

(56) References Cited

U.S. PATENT DOCUMENTS 7,807,984 B2    10/2010  Alcott et al.
2010/0308215 A1* 12/2010  Vanderberg et al. .......... 250/281

* cited by examiner

*Primary Examiner* — Robert Kim
*Assistant Examiner* — Hanway Chang
(74) *Attorney, Agent, or Firm* — WPAT, PC; Justin King

(57) ABSTRACT

A beam line system includes a hollow tube and a plurality of protruding structures. The hollow tube has an inlet and an outlet. An ion beam emitted by the ion implanter is introduced into the hollow tube through the inlet and exited from the hollow tube through the outlet. The protruding structures are formed on an inner wall of the hollow tube. Each of the protruding structures has a reflective surface for reflecting a portion of the ion beam.

18 Claims, 3 Drawing Sheets

BEAM LINE SYSTEM OF ION IMPLANTER

FIELD OF THE INVENTION

The present invention relates to a beam line system, and more particularly to a beam line system of an ion implanter.

BACKGROUND OF THE INVENTION

An ion implantation process is widely used in the manufacture of integrated circuits for implanting a dopant into a substrate. Nowadays, an ion implanter is widely used to implement the ion implantation process. By the ion implanter, the atoms or molecules to be implanted are transformed into ions, then the ions are accelerated in an electrical field to acquire energy, and finally the high-energy ions are implanted into a near-surface region of a substrate. After the ion implantation process is completed, the physical properties of the substrate are changed.

However, in some operating conditions, the dose of dopant implanted into the substrate is higher than the desired dopant dose. Under this circumstance, the performance of the semiconductor device is unstable and the quality is deteriorated.

SUMMARY OF THE INVENTION

Therefore, the present invention provides a beam line system of an ion implanter for precisely adjusting the dopant dose.

In accordance with an aspect, the present invention provides a beam line system of an ion implanter. The beam line system includes a hollow tube and a plurality of protruding structures. The hollow tube has an inlet and an outlet. An ion beam emitted by the ion implanter is introduced into the hollow tube through the inlet and exited from the hollow tube through the outlet. The protruding structures are formed on an inner wall of the hollow tube. Each of the protruding structures has a reflective surface for reflecting a portion of the ion beam.

In an embodiment, the hollow tube is a collimator tube.

In an embodiment, the hollow tube is made of graphite.

In an embodiment, the protruding structures are contiguous wedge-shaped structures on the inner wall of the hollow tube.

In an embodiment, the reflective surface of the protruding structure is substantially vertical to a traveling direction of the ion beam.

In an embodiment, a ratio of a height of the reflective surface of the protruding structure to a length of the protruding structure along a traveling direction of the ion beam is about 1:5.

In an embodiment, the portion of the ion beam which is not reflected by the protruding structures is exited from the outlet of the hollow tube.

In an embodiment, an end analyzer is positioned at a terminal of the beam line system to detect the portion of the ion beam which is exited from the outlet of the hollow tube.

In an embodiment, the end analyzer is a Faraday cup detector.

In accordance with another aspect, the present invention provides an ion implanter. The ion implanter includes an ion source, an analyzing magnet and a beam line system. The ion source is used for producing ions. The analyzing magnet is used for producing an ion beam by selecting desired types of ions. The beam line system includes a hollow tube with an inlet and an outlet and a plurality of protruding structures formed on an inner wall of the hollow tube. The ion beam is introduced into the hollow tube through the inlet and exited from the hollow tube through the outlet, wherein each of the protruding structures has a reflective surface for reflecting a portion of the ion beam.

In accordance with a further aspect, the present invention provides an ion implantation process. The ion implantation process is implemented by the beam line system of the present invention.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
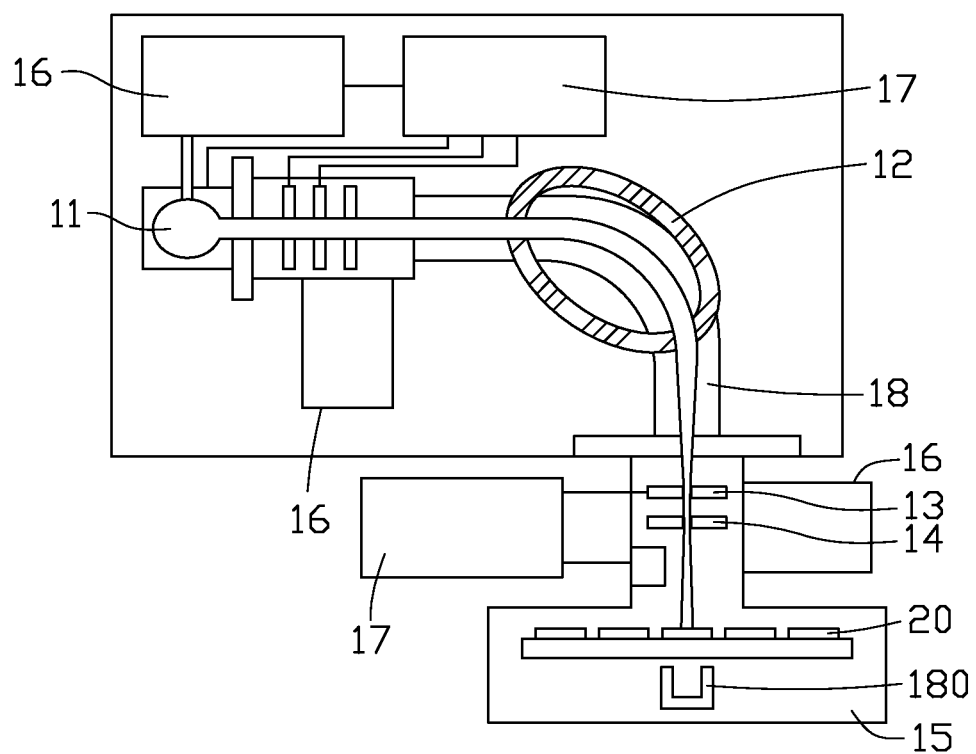
FIG. 1 is a schematic functional block diagram illustrating an ion implanter according to an embodiment of the present invention.

FIG. 1 is a schematic functional block diagram illustrating an ion implanter according to an embodiment of the present invention. The ion implanter comprises an ion source 11, an analyzing magnet 12, an accelerating system 13, a focusing system 14, a target chamber 15, a vacuum system 16, a control system 17 and a beam line system 18.

The ion source 11 is used for producing ions of a desired element by ionizing the element to positive and negative ions. The analyzing magnet 12 is employed to remove undesired types of ions, so that an ion beam with the desired types of ions is generated. Then, by the accelerating system 13, the ion beam is accelerated to have high energy. After the high-energy ion beam is focused by the focusing system 14, the focused high-energy ion beam is implanted into a target 20 (e.g. a wafer), which is contained in a target chamber 15.

The ion beam generated by the above components is transmitted through the beam line system 18. The vacuum system 16 is employed to evacuate the beam line system 18, so that the beam line system 18 is operated at very low pressure (e.g. $10^{-7}$ to $10^{-8}$ torr). The control system 17 is used to control the components of the beam line system 18 in order to facilitate normal and smooth operations. Moreover, an end analyzer 180 is positioned at a terminal of the beam line system 18 to correct ion energy, beam current and beam profile. An example of the end analyzer 180 is a Faraday cup detector.

Figure 2A:
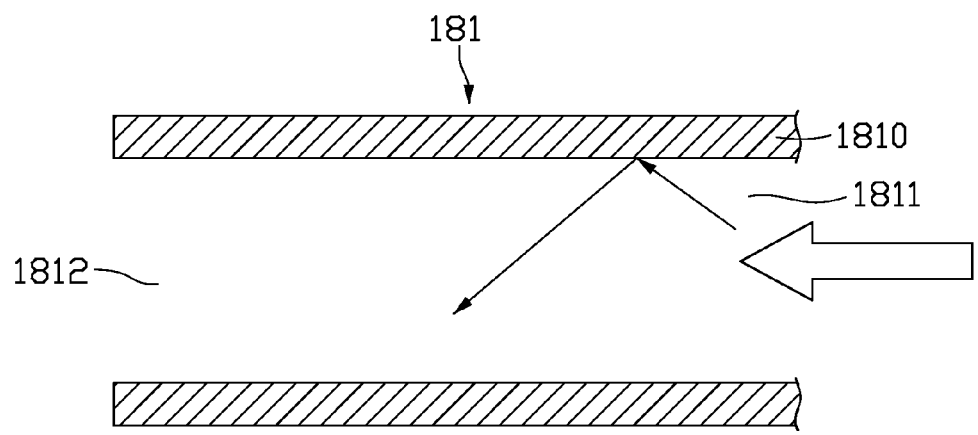
FIG. 2A is a schematic cross-sectional view illustrating a segment of the beam line system having a flat inner wall.
Figure 2B:
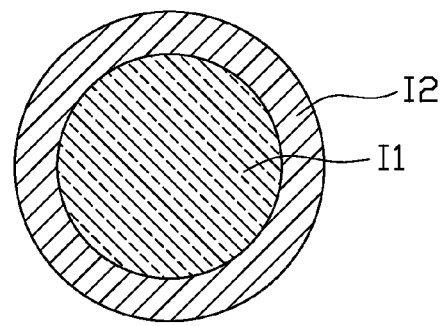
FIG. 2B schematically illustrates the occurrence of a halo beam effect.

However, the use of the end analyzer 180 to correct energy, beam current and beam profile still has some drawbacks. For example, since the Faraday cup detector has size restriction, the end analyzer 180 implemented by the Faraday cup detector fails to completely detect all of the ions that are transmitted to the wafer 20 through the beam line system 18. As shown in FIG. 2A, a hollow tube 181 of the beam line system 18 has an inlet 1811 and an outlet 1812. The ion beam emitted by the ion implanter is introduced into the hollow tube 181 through the inlet 1811 and exited from the hollow tube 181 through the outlet 1812. The hollow tube 181 is made of graphite. Since the inner wall 1810 of the hollow tube 181 is flat, the ion beam reflected by the inner wall 1810 is readily scattered. FIG. 2B schematically illustrates the occurrence of a halo beam effect. Ideally, if the ion beam is not reflected by the inner wall 1810, the ion beam exited from the outlet 1812 is centralized to have a first ion beam profile 11. In practice, since a portion of the ion beam is reflected by the inner wall 1810, the ion beam exited from the outlet 1812 is somewhat decentralized to have a second ion beam profile 12. Under this circumstance, a so-called halo beam effect occurs. Due to the halo beam effect, more ion beams fail to be detected by the end analyzer 180. Under this circumstance, the dopant dose can not be precisely controlled by the control system 17.

Figure 3:
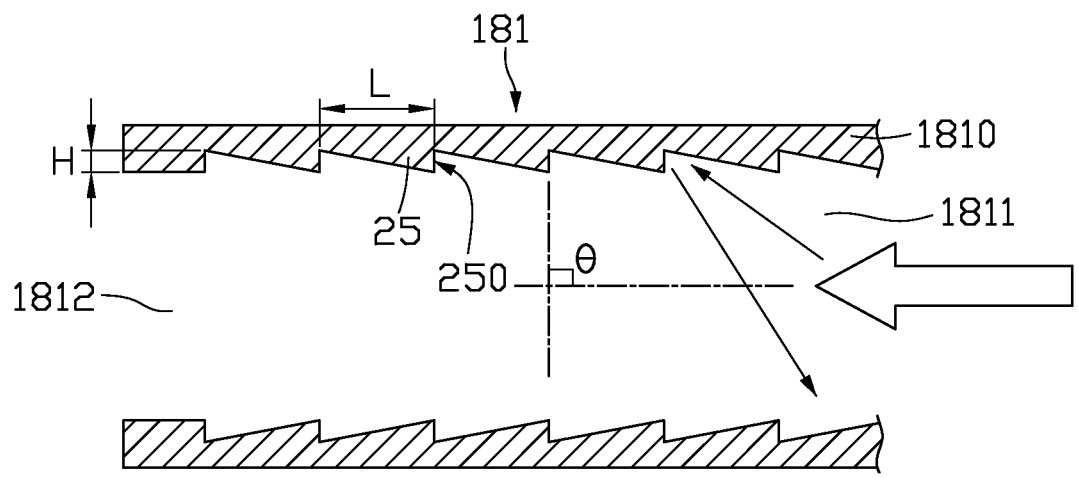
FIG. 3 is a schematic cross-sectional view illustrating a segment of the beam line system used in an ion implanter according to an embodiment of the present invention.

For solving these drawbacks, the beam line system 18 should be further improved. In an embodiment, the present invention is aimed at the improvement of the configurations of the beam line system 18. FIG. 3 is a schematic cross-sectional view illustrating a segment of the beam line system used in an ion implanter according to an embodiment of the present invention. In FIG. 3, a hollow tube 181 of the beam line system 18 is shown. The hollow tube 181 has an inlet 1811 and an outlet 1812. The ion beam emitted by the ion implanter is introduced into the hollow tube 181 through the inlet 1811 and exited from the hollow tube 181 through the outlet 1812. In accordance with a key feature, the inner wall 1810 of the hollow tube 181 is processed to have a special shape. In this embodiment, a plurality of protruding structures 25 are formed on the inner wall 1810 of the hollow tube 181. Each of the protruding structures 25 has a reflective surface 250 for reflecting a portion of the scattered ion beam and changing the direction of the scattered ion beam. In such way, the proportion of the scattered ion beam to be exited from the outlet 1812 will be reduced. As shown in FIG. 3, these protruding structures 25 are contiguous wedge-shaped structures on the inner wall 1810 of the hollow tube 181. The reflective surface 250 faces the traveling direction of the ion beam. Moreover, an included angle θ between the reflective surface 250 and the traveling direction of the ion beam is 45~135 degrees, and preferably 90 degrees. In this embodiment, the included angle θ between the reflective surface 250 and the traveling direction of the ion beam is 90 degree. That is, the reflective surface 250 is substantially vertical to the traveling direction of the ion beam. In this embodiment, the height H of the reflective surface 250 is 2 mm, and the length L of the protruding structure 25 along the traveling direction of the ion beam is 10 mm. In other words, a ratio of the height H of the reflective surface 250 of the protruding structure 25 to the length L of the protruding structure 25 along the traveling direction of the ion beam is about 1:5. Since the reflective surface 250 is effective for reflecting a portion of the scattered ion beam and changing the direction of the scattered ion beam, the proportion of the scattered ion beam to be exited from the outlet 1812 is largely reduced. Under this circumstance, the scattered ion beam to be implanted into the wafer 20 and detected by the end analyzer 180 will be minimized or eliminated. Therefore, the dopant dose of the ion implanter can be precisely controlled.

Figure 4:
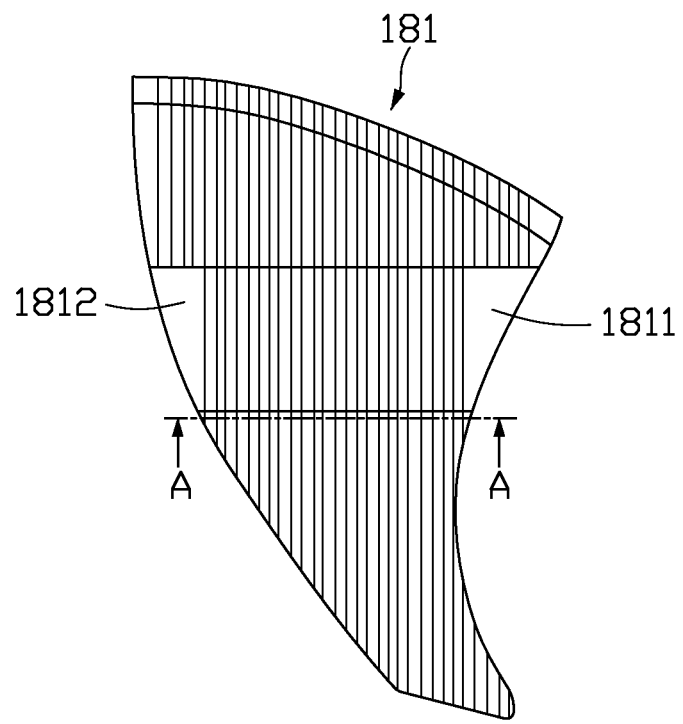
FIG. 4 schematically illustrates an application example of the hollow tube of the beam line system according to an embodiment of the present invention.

FIG. 4 schematically illustrates an application example of the hollow tube of the beam line system according to an embodiment of the present invention. In this embodiment, the hollow tube 181 is equipped at a collimator of the ion implanter, and has an inlet 1811 and an outlet 1812. That is, the hollow tube 181 is a collimator tube, which is made of graphite. The cross section of the hollow tube 181 along the line AA may be illustrated with reference to the configurations of FIG. 3.

From the above description, since the beam line system of the present invention has special inner wall configurations of the hollow tube, the proportion of the scattered ion beam is minimized. As a consequence, the dopant dose of the ion implanter can be precisely controlled.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A beam line system of an ion implanter, the beam line system comprising:
   a hollow tube having an inlet and an outlet, wherein the hollow tube is a collimator tube, an ion beam emitted by the ion implanter is introduced into the hollow tube through the inlet and exited from the hollow tube through the outlet; and
   a plurality of protruding structures formed on an inner wall of the hollow tube, wherein each of the protruding structures has a reflective surface for reflecting a portion of the ion beam.

2. The beam line system according to claim 1, wherein the hollow tube is made of graphite.

3. The beam line system according to claim 1, wherein the protruding structures are contiguous wedge-shaped structures on the inner wall of the hollow tube.

4. The beam line system according to claim 1, wherein the reflective surface of the protruding structure is substantially vertical to a traveling direction of the ion beam.

5. The beam line system according to claim 1, wherein a ratio of a height of the reflective surface of the protruding structure to a length of the protruding structure along a traveling direction of the ion beam is about 1:5.

6. The beam line system according to claim 1, wherein the portion of the ion beam which is not reflected by the protruding structures is exited from the outlet of the hollow tube.

7. The beam line system according to claim 6, wherein an end analyzer is positioned at a terminal of the beam line system to detect the portion of the ion beam which is exited from the outlet of the hollow tube.

8. The beam line system according to claim 7, wherein the end analyzer is a Faraday cup detector.

9. An ion implantation process, which is implemented by the beam line system according to claim 1.

10. An ion implanter, comprising:
   an ion source for producing ions;
   an analyzing magnet for producing an ion beam by selecting desired types of ions; and
   a beam line system for transmitting the ion beam, wherein the beam line system comprises a hollow tube with an inlet and an outlet and a plurality of protruding structures formed on an inner wall of the hollow tube, wherein the hollow tube is a collimator tube, the ion beam is introduced into the hollow tube through the inlet and exited from the hollow tube through the outlet, wherein each of the protruding structures has a reflective surface for reflecting a portion of the ion beam.

11. The ion implanter according to claim 10, further comprising:

an accelerating system for accelerating the ion beam;

a focusing system for focusing the accelerated ion beam; and a target chamber for receiving the ion beam from the focusing system.

12. The ion implanter according to claim 10, wherein the hollow tube is made of graphite.

13. The ion implanter according to claim 10, wherein the protruding structures are contiguous wedge-shaped structures on the inner wall of the hollow tube.

14. The ion implanter according to claim 10, wherein the reflective surface of the protruding structure is substantially vertical to a traveling direction of the ion beam.

15. The ion implanter according to claim 10, wherein a ratio of a height of the reflective surface of the protruding structure to a length of the protruding structure along a traveling direction of the ion beam is about 1:5.

16. The ion implanter according to claim 10, wherein the portion of the ion beam which is not reflected by the protruding structures is exited from the outlet of the hollow tube.

17. The ion implanter according to claim 16, wherein an end analyzer is positioned at a terminal of the beam line system to detect the portion of the ion beam which is exited from the outlet of the hollow tube.

18. The ion implanter according to claim 17, wherein the end analyzer is a Faraday cup detector.

* * * * *